(12) United States Patent
Huang et al.

(10) Patent No.: US 10,114,569 B2
(45) Date of Patent: Oct. 30, 2018

(54) COMPUTING SYSTEM WITH SHIFT EXPANDABLE CODING MECHANISM AND METHOD OF OPERATION THEREOF

(71) Applicant: CNEX LABS, Inc., San Jose, CA (US)

(72) Inventors: Yiren Ronnie Huang, San Jose, CA (US); Xiaojie Zhang, Saratoga, CA (US)

(73) Assignee: CNEX LABS, Inc., San Jose, CA (US)

( * ) Notice: Subject to any disclaimer, the term of this patent is extended or adjusted under 35 U.S.C. 154(b) by 41 days.

(21) Appl. No.: 15/370,476

(22) Filed: Dec. 6, 2016

(65) Prior Publication Data
US 2018/0101318 A1 Apr. 12, 2018

Related U.S. Application Data

(60) Provisional application No. 62/405,804, filed on Oct. 7, 2016.

(51) Int. Cl.
G11C 29/00 (2006.01)
G06F 3/06 (2006.01)
G06F 11/10 (2006.01)
G11C 29/52 (2006.01)
H03M 13/11 (2006.01)
H03M 13/29 (2006.01)

(52) U.S. Cl.
CPC ............ *G06F 3/0619* (2013.01); *G06F 3/064* (2013.01); *G06F 3/0629* (2013.01); *G06F 3/0679* (2013.01); *G06F 11/1068* (2013.01); *G11C 29/52* (2013.01); *H03M 13/1105* (2013.01); *H03M 13/2906* (2013.01)

(58) Field of Classification Search
CPC ...... G06F 3/0619; G06F 3/0629; G06F 3/064; G06F 3/0679; G06F 11/1068; G11C 29/52; H03M 13/1105; H03M 13/2906
See application file for complete search history.

(56) References Cited

U.S. PATENT DOCUMENTS 8,065,598 B1 * 11/2011 Gunnam .............. H03M 13/116
714/800
2007/0011557 A1 * 1/2007 Zheng ............... H03M 13/2771
714/752

(Continued)

Primary Examiner — Guerrier Merant
(74) Attorney, Agent, or Firm — Perspectives Law Group, Corp.

(57) ABSTRACT

A computing system includes: a control circuit configured to: determine a user data, generate a base set including a base protection data based on encoding the user data according to a coding mechanism, generate an extra protection data based on encoding the user data differently from the base set according to the coding mechanism; and a storage circuit configured to store the extra protection data corresponding to the base set.

The computing system can further include: an storage circuit configured to: provide a received codeword corresponding to a user data and a base protection data, provide an extra protection data corresponding to the received codeword; a control circuit configured to: decode the received codeword according to a coding mechanism, and further decode the received codeword to recover the user data based on decoding differently from decoding the base set and using the extra protection data according to the coding mechanism.

20 Claims, 5 Drawing Sheets

(56) References Cited

U.S. PATENT DOCUMENTS

| | | | |
|---|---|---|---|
| 2008/0065969 A1* | 3/2008 | Jain | H03M 13/2732 714/784 |
| 2009/0199069 A1* | 8/2009 | Palanki | H04L 1/0065 714/755 |
| 2009/0199073 A1* | 8/2009 | Kanaoka | G11B 20/1833 714/758 |
| 2011/0138258 A1* | 6/2011 | Okamura | H03M 13/1102 714/780 |
| 2014/0223256 A1* | 8/2014 | Sakai | G06F 11/1012 714/758 |
| 2015/0012794 A1* | 1/2015 | Losh | G06F 11/1008 714/755 |

* cited by examiner

COMPUTING SYSTEM WITH SHIFT EXPANDABLE CODING MECHANISM AND METHOD OF OPERATION THEREOF

TECHNICAL FIELD

An embodiment of the present invention relates generally to a computing system, and more particularly to a system for data protection.

BACKGROUND

Modern consumer and industrial electronics, such as various local or distributed or networked storage systems, graphical computing systems, televisions, projectors, cellular phones, portable digital assistants, and combination devices, are providing increasing levels of functionality to support modern life including three-dimensional display services. Research and development in the existing technologies can take a myriad of different directions. As data become more pervasive, existing and new systems need to interoperate and provide data reliability.

Thus, a need still remains for a computing system with expandable coding mechanism to provide improved data reliability and recovery. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides a system, including: a control circuit configured to: determine a user data, generate a base set including a base protection data based on encoding the user data according to a Low-Density Parity-Check coding mechanism, generate an extra protection data based on encoding the user data differently from the base set according to the Low-Density Parity-Check coding mechanism; and a storage circuit, coupled to the control circuit, configured to store the extra protection data corresponding to the base set.

An embodiment of the present invention provides a method including: determining a user data; generating a base set including a base protection data generating, with a control circuit, an extra protection data based on encoding the user data differently from the base set according to the Low-Density Parity-Check coding mechanism; and storing the extra protection data corresponding to the base set.

An embodiment of the present invention provides a system, including an access circuit configured to: provide a received codeword corresponding to a user data and a base protection data, provide an extra protection data corresponding to the received codeword; a control circuit, coupled to the access circuit, configured to: decode the received codeword according to a Low-Density Parity-Check coding mechanism, and further decode the received codeword to recover the user data based on decoding differently from decoding the base set and using the extra protection data according to the Low-Density Parity-Check coding mechanism.

An embodiment of the present invention provides a method including: accessing a received codeword; decoding the received codeword according to a Low-Density Parity-Check coding mechanism; accessing an extra protection data corresponding to the received codeword; further decoding, with a control circuit, the received codeword to recover the user data based on decoding differently from decoding the base set and using the extra protection data according to the Low-Density Parity-Check coding mechanism.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

Figure 1:
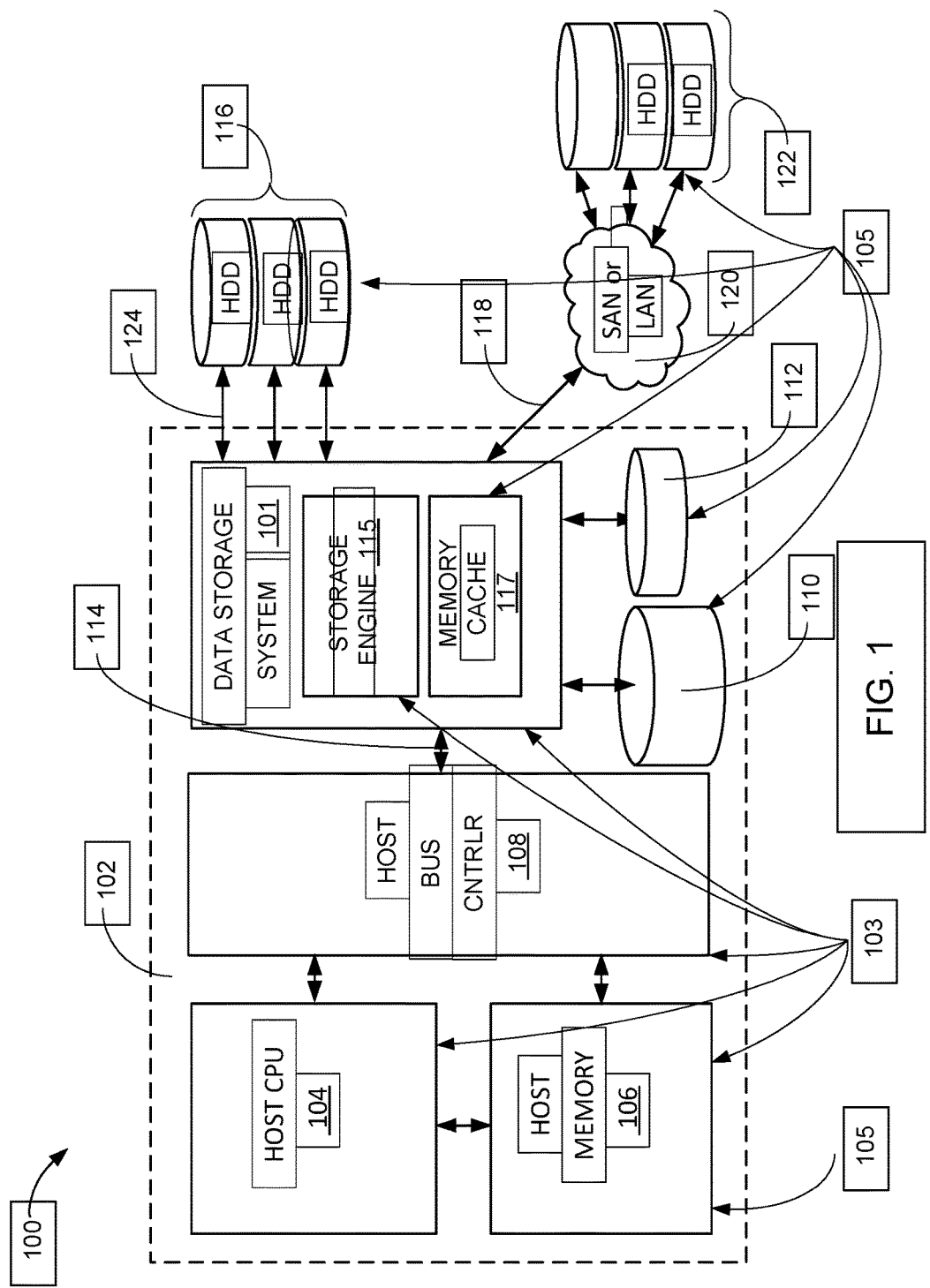
FIG. 1 is a computing system with expandable coding mechanism in an embodiment of the present invention.

The following embodiments can provide extra protection data based on further decoding a base set. The base set can include base protection data resulting from initially encoding user data. The base protection data and the extra protection data can both be processed using a same encoder or encoding-decoding mechanism. The extra protection data can be calculated or generated based on one or more different derivations or permutations of the user data or the base set. The extra protection data can be stored in a separate location or device from the base set, such as a different or "good" instance of a data page to provide additional error correction power for the base set stored in "bad" page for NAND Flash storage embodiments.

A decoder can be utilized to decode a received codeword corresponding to the base set. If the decoding operation returns an inner-decoding failure status using the base protection data, the decoder can utilize the extra protection data to recover the user data, the base protection data, or a combination thereof. The decoder can generate received data permutation from the received codeword, similar to or same as the methodology for the one or more different derivations or permutations. The decoder can use the extra protection data along with the received data permutation to recover the user data, the base protection data, or a combination thereof.

The following embodiments are described in sufficient detail to enable those skilled in the art to make and use the invention. It is to be understood that other embodiments would be evident based on the present disclosure, and that system, process, or mechanical changes may be made without departing from the scope of an embodiment of the present invention.

In the following description, numerous specific details are given to provide a thorough understanding of the invention. However, it will be apparent that the invention may be practiced without these specific details. In order to avoid obscuring an embodiment of the present invention, some well-known circuits, system configurations, and process steps are not disclosed in detail.

The drawings showing embodiments of the system are semi-diagrammatic, and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the invention can be operated in any orientation. The embodiments have been numbered first embodiment, second embodiment, etc. as a matter of descriptive convenience and are not intended to have any other significance or provide limitations for an embodiment of the present invention.

The term "module" referred to herein can include software, hardware, or a combination thereof in an embodiment of the present invention in accordance with the context in which the term is used. For example, the software can be machine code, firmware, embedded code, and application software. Also for example, the hardware can be circuitry, processor, computer, integrated circuit, integrated circuit cores, a pressure sensor, an inertial sensor, a microelectromechanical system (MEMS), passive devices, or a combination thereof. Further, if a module is written in the apparatus claims section below, the modules are deemed to include hardware circuitry for the purposes and the scope of apparatus claims.

Referring now to FIG. 1, therein is shown a computing system 100 with expandable coding mechanism in an embodiment of the present invention. The computing system 100 is depicted in FIG. 1 as a functional block diagram of the computing system 100 with a data storage system 101. The functional block diagram depicts the data storage system 101 installed in a host computer 102.

As an example, the host computer 102 can be as a server or workstation. The host computer 102 can include at least a host central processing unit 104, host memory 106 coupled to the host central processing unit 104, and a host bus controller 108. The host bus controller 108 provides a host interface bus 114, which allows the host computer 102 to utilize the data storage system 101.

It is understood that the function of the host bus controller 108 can be provided by host central processing unit 104 in some implementations. The host central processing unit 104 can be implemented with hardware circuitry in a number of different manners. For example, the host central processing unit 104 can be a processor, an application specific integrated circuit (ASIC) an embedded processor, a microprocessor, a hardware control logic, a hardware finite state machine (FSM), a digital signal processor (DSP), or a combination thereof.

The data storage system 101 can be coupled to a solid state disk 110, such as a non-volatile memory based storage device having a peripheral interface system, or a non-volatile memory 112, such as an internal memory card for expanded or extended non-volatile system memory.

The data storage system 101 can also be coupled to hard disk drives (HDD) 116 that can be mounted in the host computer 102, external to the host computer 102, or a combination thereof. The solid state disk 110, the non-volatile memory 112, and the hard disk drives 116 can be considered as direct attached storage (DAS) devices, as an example.

The data storage system 101 can also support a network attach port 118 for coupling a network 120. Examples of the network 120 can be a local area network (LAN) and a storage area network (SAN). The network attach port 118 can provide access to network attached storage (NAS) devices 122.

While the network attached storage devices 122 are shown as hard disk drives, this is an example only. It is understood that the network attached storage devices 122 could include magnetic tape storage (not shown), and storage devices similar to the solid state disk 110, the non-volatile memory 112, or the hard disk drives 116 that are accessed through the network attach port 118. Also, the network attached storage devices 122 can include just a bunch of disks (JBOD) systems or redundant array of intelligent disks (RAID) systems as well as other network attached storage devices 122.

The data storage system 101 can be attached to the host interface bus 114 for providing access to and interfacing to multiple of the direct attached storage (DAS) devices via a cable 124 for storage interface, such as Serial Advanced Technology Attachment (SATA), the Serial Attached SCSI (SAS), or the Peripheral Component Interconnect—Express (PCI-e) attached storage devices.

The data storage system 101 can include a storage engine 115 and memory devices 117. The storage engine 115 can be implemented with hardware circuitry, software, or a combination thereof in a number of ways. For example, the storage engine 115 can be implemented as a processor, an application specific integrated circuit (ASIC) an embedded processor, a microprocessor, a hardware control logic, a hardware finite state machine (FSM), a digital signal processor (DSP), or a combination thereof.

The storage engine 115 can control the flow and management of data to and from the host computer 102, and from and to the direct attached storage (DAS) devices, the network attached storage devices 122, or a combination thereof. The storage engine 115 can also perform data reliability check and correction, which will be further discussed later. The storage engine 115 can also control and manage the flow of data between the direct attached storage (DAS) devices and the network attached storage devices 122 and amongst themselves. The storage engine 115 can be implemented in hardware circuitry, a processor running software, or a combination thereof.

For illustrative purposes, the storage engine 115 is shown as part of the data storage system 101, although the storage engine 115 can be implemented and partitioned differently. For example, the storage engine 115 can be implemented as part of in the host computer 102, implemented partially in software and partially implemented in hardware, or a combination thereof. The storage engine 115 can be external to the data storage system 101. As examples, the storage engine 115 can be part of the direct attached storage (DAS) devices described above, the network attached storage devices 122, or a combination thereof. The functionalities of the storage engine 115 can be distributed as part of the host computer 102, the direct attached storage (DAS) devices, the network attached storage devices 122, or a combination thereof.

The memory devices 117 can function as a local cache to the data storage system 101, the computing system 100, or a combination thereof. The memory devices 117 can be a volatile memory or a nonvolatile memory. Examples of the volatile memory can be static random access memory (SRAM) or dynamic random access memory (DRAM).

The storage engine 115 and the memory devices 117 enable the data storage system 101 to meet the performance requirements of data provided by the host computer 102 and store that data in the solid state disk 110, the non-volatile memory 112, the hard disk drives 116, or the network attached storage devices 122.

For illustrative purposes, the data storage system 101 is shown as part of the host computer 102, although the data storage system 101 can be implemented and partitioned differently. For example, the data storage system 101 can be implemented as a plug-in card in the host computer 102, as part of a chip or chipset in the host computer 102, as partially implement in software and partially implemented in hardware in the host computer 102, or a combination thereof. The data storage system 101 can be external to the host computer 102. As examples, the data storage system 101 can be part of the direct attached storage (DAS) devices described above, the network attached storage devices 122, or a combination thereof. The data storage system 101 can be distributed as part of the host computer 102, the direct attached storage (DAS) devices, the network attached storage devices 122, or a combination thereof.

The computing system 100 can include and utilize an encoding and decoding mechanism for processing information. The computing system 100 can encode the information prior to storage. The computing system 100 can decode the stored data for accessing the information. The computing system 100 can utilize the encoding and decoding mechanism to detect, correct, or a combination for errors. The computing system 100 can further utilize the encoding and decoding mechanism for data compression, cryptography, communication, or a combination thereof.

The computing system 100 can utilize an encoding-decoding mechanism 170. The encoding-decoding mechanism 170 is a circuit, a device, a method, a system, a process, or a combination thereof for converting data from one form to another.

The encoding-decoding mechanism 170 can be used to encode intended or targeted data for providing error protection, error detection, error correction, redundancy, or a combination thereof. The encoding-decoding mechanism 170 can be used to decode received or accessed data to recover the intended or target data based on error detection, error correction, redundancy, or a combination of processes thereof.

The encoding-decoding mechanism 170 can be based on a standard, an algorithm, or a combination thereof predetermined by or known to the computing system 100. For example, the computing system 100 can utilize linear codes, such as including linear block codes or convolutional codes.

As a more specific example, the computing system 100 can utilize cyclic codes, repetition codes, parity codes, polynomial codes, geometric codes, block codes, algebraic codes, probabilistic codes, or a combination thereof. Also as a more specific example, the computing system 100 can utilize the encoding-decoding mechanism 170 including a Low-Density Parity-Check (LDPC) coding mechanism 172. The LDPC coding mechanism 172 can be for implementing or utilizing linear error correcting codes with bipartite graph.

The encoding-decoding mechanism 170 can be included in, integral with, or a combination thereof for the host computer 102 or a portion or circuit therein, the solid state disk 116, the network attached storage devices 122, or a combination thereof. For illustrative purposes, the computing system 100 will be described as utilizing the LDPC coding mechanism 172. However, it is understood that the computing system 100 can utilize any other type of coding mechanism as described above.

Also for illustrative purposes, the computing system 100 will be described as utilizing the coding mechanism in storing and accessing information with NAND flash memory. However, it is understood that the computing system 100 can utilize the coding mechanism with other types of memory, such as volatile memory, other types of flash or non-volatile memory, or a combination thereof. The computing system 100 can further utilize the coding mechanism with other applications, such as communication or cryptography, as discussed above.

In NAND flash storage, the basic unit of NAND read can be a page, whose size can be fixed throughout its lifetime. The size of a NAND flash page can usually be 8 KB or 16 KB, along with some extra space that can be called "spare space", and can be generally used for storing meta-data and error correction code (ECC) redundancy. The amount of user data stored per page can be fixed, such as for 8 KB, 16 KB, or other size depending on the NAND flash physical size specification.

The spare space that can be used for ECC parities can also be fixed. For the same type of ECC, the code rate, or the ratio of its information size to its code length known as information size plus parity size, determines its error correction power. Generally speaking, with larger parity, more bits can be corrected using an ECC codeword. Therefore, when ECC codewords, including both user data and parities, are stored in a single NAND flash page, the correction power provided by the ECC can be fixed throughout the lifetime of the NAND.

However, the characteristic of NAND flash can lead to the number of error bits increasing as the number of program/erase (P/E) cycles increases. In other words, in order to increase the reliability of NAND flash at or towards its end of lifetime or to extend its lifetime, stronger ECC that can correct more error bits can be required as P/E cycles increases.

Further, certain NAND flash pages can be more prone to errors than others. The computing system 100 can utilize stronger ECC to protect such "bad page", and utilize ECC of regular strength for other pages to provide sufficient error correction power.

The computing system 100 can utilize extra or additional coding mechanism in addition to and in combination with other coding mechanism. The computing system 100 can utilize ECC codewords whose parities can be divided and stored in separate places. The computing system 100 can store part of the ECC parity in the same flash page as user data to provide fast access and regular error correction power by itself, and other part of the ECC parity can be stored somewhere else and received only when regular decoding fails.

Figure 2:
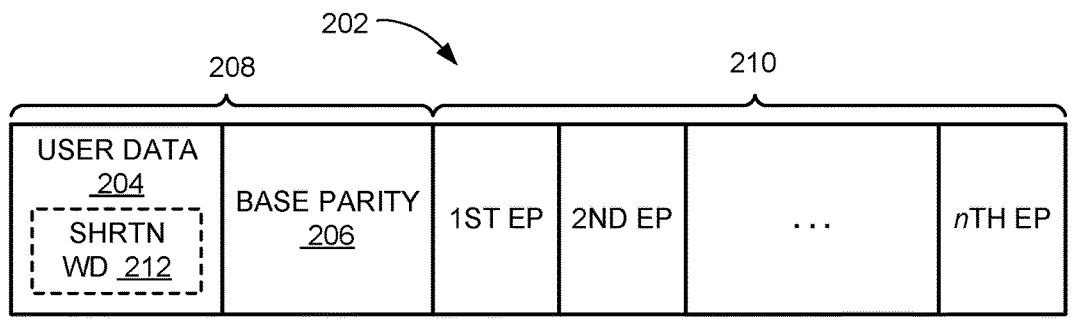
FIG. 2 is an exemplary diagram of a data unit in an embodiment.

Referring now to FIG. 2, therein is shown an exemplary diagram of a data unit 202 in an embodiment. The data unit 202 can include an encoded output for user data 204. The data unit 202 can include the user data 204 along with base protection data 206 for a base set 208, extra protection data 210, or a combination thereof.

The user data 204 can include the information or data serving as content. The user data 204 can be the target or the subject of the encoding process and the desired result of the decoding process. For example, the user data 204 can include the content intended for storage and retrieval at a later time or a different device, for communication between devices, for encryption and decryption, or a combination thereof.

The computing system 100 can process the user data 204 to generate the base protection data 206. The base protection data 206 is information corresponding to the user data 204, utilized to detect errors in the base set 208, to correct errors in the base set 208, or a combination thereof in accessing the base set 208 at a later time, at a different device, or a combination thereof. For example, the base protection data 206 can include redundancy data, parity data, or a combination thereof, such as cyclic redundancy check (CRC) redundancy or LDPC parity information.

The computing system 100 can utilize the user data 204 and the base protection data 206 as the base set 208. The computing system 100 can combine the user data 204 and the base protection data 206 for the base set 208. The computing system 100 can further append the base protection data 206 to the user data 204 for the base set 208.

The computing system 100 can store or communicate the base set 208 as a single unit of encoded information, such as a codeword. For example, the computing system 100 can store the user data 204 and the corresponding instance of the base protection data 206 in the same data page, sector, chip, address, or a combination thereof. Also for example, the computing system 100 can communicate the user data 204 and the corresponding instance of the base protection data 206 sequentially in time, over the same frequency, using the same channel or resource, or a combination thereof.

As a more specific example, the base set 208 can represent an original systematic LDPC codeword. Also as a more specific example, the base set 208 can be a shortened codeword 212. The shortened codeword 212 can correspond to a size or a length of data or information less than prescribed by or a maximum for the encoding-decoding mechanism 170 of FIG. 1.

The computing system 100 can further process the base set 208 for increased protection against data errors or loss. The computing system 100 can encode the base set 208 further to generate the extra protection (EP) 210. The extra protection data 210 can be similar to the base protection data 206.

For example, the extra protection data 210 can include or be based on a permutation of the user data 204. Also for example, the extra protection data 210 can include CRC redundancy of the base set 208 in addition to the user data 204. Also for example, the extra protection data 210 can be generated with the base set 208 where the base set 208 can be treated as another type of user data and the base protection data 206 can be also be considered as part of user data.

The computing system 100 can process the base set 208 multiple times to further encode with the encoding result of the previous iteration. For example, the first instance of the extra protection data 210 can be based on processing or encoding the base set 208. The second instance of the extra protection data 210 can be based on processing or encoding the base set along with or in addition to the first instance of the extra protection data 210. The length of each EP does not have to be the same, and can be configured differently according to system requirement.

The computing system 100 can generate the extra protection data 210 using the same hardware, process, method, circuitry, or a combination thereof as the base parity 206. For example, the computing system 100 can generate the extra protection data 210 using the same encoding module as the base protection data 206. Also for example, the computing system 100 can generate the extra protection data 210 based on using or sharing circuitry utilized for the encoding process, the decoding process, or a combination thereof.

The computing system 100 can store or communicate the extra protection data 210 along with or separate from the user data 204, the base protection data 206, the base set 208, or a combination thereof. The computing system 100 can also store or communicate the different parts of the extra protection data 210, denoted as nTH EP in FIG. 2, together or separately. For example, the base set 208 and the extra protection data 210 can be stored at the same location or resource, communicated together, or a combination thereof, such as for the user data 204 and the base protection data 206. Similarly, the different parts of the extra protection data 210 can be stored or communicated in the above way.

Also for example, the user data 204, the base protection data 206, the base set 208, or a combination thereof and the extra protection data 210 can be separated and stored at different data pages, sectors, chips, addresses, or a combination thereof. Also for example, the user data 204, the base protection data 206, the base set 208, or a combination thereof and the extra protection data 210 can be separated and communicated at different times, over different frequencies, using different channels or resources, or a combination thereof. Similarly, the different parts of the extra protection data 210 can be stored or communicated in the above way For illustrative purposes, although embodiments of the computing system 100 are described with the extra protect data 210 protecting the user data 204 and some permutations of the user data 204, it is understood that the computing system 100 can operate in different ways. For example, the extra protection data 210 can be further protected by one or more different ECC codeword. Further, multiple instances of the extra protection data 210 can be packed into one single ECC codeword and share the same ECC parity.

It has been discovered that the extra protection data 210 provides stronger error correction capabilities. The extra protection data 210 provides additional recoverability based providing further redundancies or parities. Moreover, the extra protection data 210 can be configured to adapt and provide varying or dynamic coding rate. The extra protection data 210 can be used to dynamically vary the overhead or redundancy in comparison to the user data 204 without being limited to a fixed size or dimension according to the coding scheme. Each of the extra protection data 210 can work on one or more permutations of the user data 204. Each of the extra protection data 210 can work on different permutations of the user data 204.

It has further been discovered that the extra protection data 210 utilizing the same encoding module as the base protection data 208 provides stronger error correction capabilities without added cost or resources. The same encoding scheme can be repeated to generate the extra protection data 210, which also means that the decoding process can remain the same or with minimal changes. The repetitive pattern can be leveraged to decode, minimizing the need for additional modules to save memory, circuit size, processing speed, processing efficiency, additional functions or a combination thereof. The extra protection data 210 can further leverage simple and standard code designs leading to simple encoder and decoder designs with efficiency in implementation.

It has further been discovered that the extra protection data 210 stored or communicated separate from the user data 204, the base protection data 206, or the base set 208 provides reduced error rates. The computing system 100 can utilize a data page, a sector, a circuit portion, a resource, a channel, a frequency, or a combination thereof known to be bad or below some threshold predetermined by the computing system 100 for the user data 204, the base protection data 206, or the base set 208. The computing system 100 can utilize a different page, sector, circuit portion, resource, channel, frequency, or a combination thereof to store or communicate the extra protection data 210 to increase the recoverability of the base set 208.

For example, correction power, which is otherwise limited by the spare size and fixed through the life time of a NAND flash page, can be varied using the extra protection data 210. Without increasing the space to account for the increase in the base protection data 206 to increase the correction power, the computing system 100 can generate the extra protection data 210 for the user data 204 stored on known bad pages. The extra protection data 210 can be stored separately on a good page, which can increase the recoverability of the user data 204 stored on the bad page. It has been discovered that the extra protection data 210 stored on the good page of NAND flash page can extend the life of the flash device and the bad pages therein. The size or capacity of the extra protection data 210 can be controlled based on an amount of error correction power desired for the computing system 100.

As a more specific example, one page size can be 16K Bytes for the user data 204 some spare space for parity information, such as 1872 Bytes of spare. For other examples, the user data 204 can be 16 KB with spare size of 2208 Bytes, 1280 Bytes or 1952 Bytes.

The computing system 100 can use the host central processing unit 104 of FIG. 1, the host memory 106 of FIG. 1, the host bus controller 108 of FIG. 1, the data storage system 101 of FIG. 1, the storage engine 115 of FIG. 1, a portion thereof, or a combination thereof to process and encode as discussed above. The computing system 100 can store the various information, such as the user data 204, the base protection data 206, the base set 208, or a combination thereof in the host memory 106, the memory cache 117 of FIG. 1, the solid state disk 110 of FIG. 1, the non-volatile memory 112 of FIG. 1, the hard disk drives 116 of FIG. 1, the NAS devices 122 of FIG. 1, or a combination thereof. The computing system 100 can store the extra protection data 210 along with or separate from the base set 208, such as in a different instance of or a different location within the host memory 106, the memory cache 117, the solid state disk 110, the non-volatile memory 112, the hard disk drives 116, the NAS devices 122, or a combination thereof.

Figure 3:
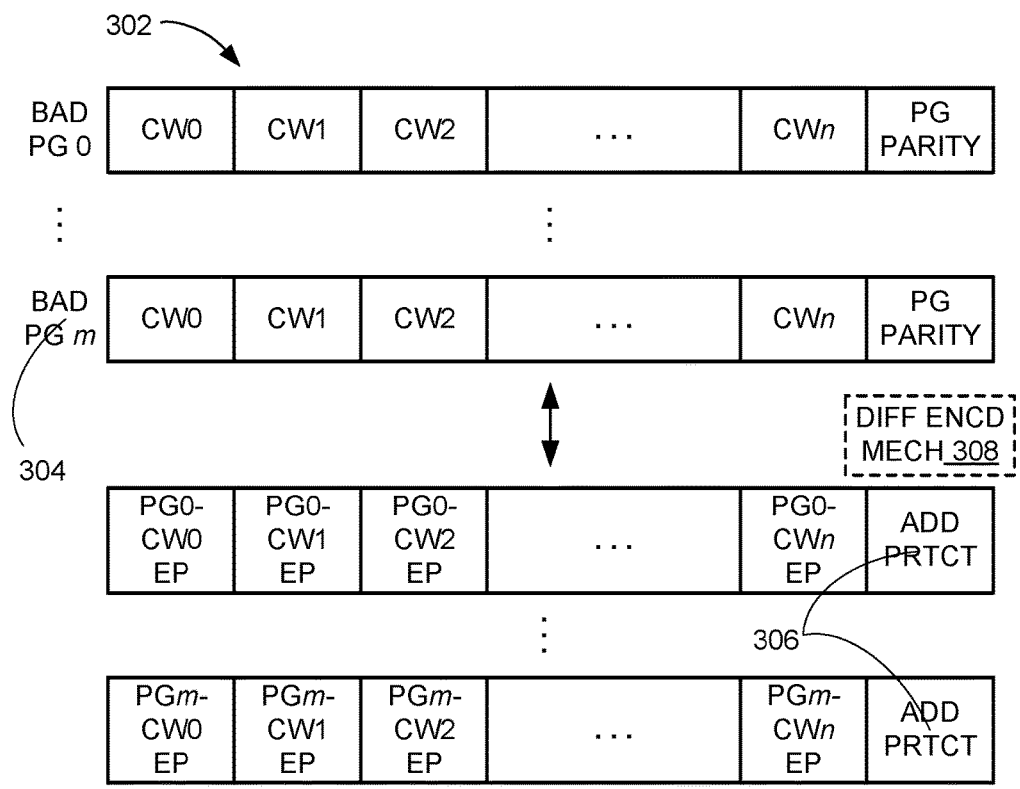
FIG. 3 is an exemplary diagram of a data group in an embodiment.

Referring now to FIG. 3, therein is shown an exemplary diagram of a data group 302 in an embodiment. The data group 302 can include multiple instances of the base set 208 of FIG. 2, the corresponding instance of the extra protection data 210 of FIG. 2, or a combination thereof.

For example, the data group 302 can include one or more flash data pages 304, each including or storing multiple instances of the base set 208, multiple instances of the extra protection data 210, or a combination thereof. Each of the stored instances of the base set 208 can further correspond to an instance of the extra protection data 210 stored on a different page.

As a more specific example, the computing system 100 can include a NAND flash device including "good page" and "bad page" for storing data. The "good page" and "bad page" can be determined based on a criterion, a condition, a threshold, or a combination thereof predetermined by the computing system 100.

Each of the data pages 304 of the NAND flash drive can include 16 instances of 1 KB codewords for the base set 208. The computing system 100 can further generate and utilize a group protection data for the data group 302, such as a page. The computing system 100 can further utilize further protection utilizing other directions, such as vertically across the data pages 304, diagonally according to a shifting pattern going across the data pages 304, or a combination thereof. However, the extra protection can work without such group protection.

Depending on the application, one or more instances of the extra protection data 210 can also have its own ECC parity or protection data to correct possible errors. Different EPs of different codeword from the same flash page do not have to be stored together but can be stored in different locations.

For illustrative purposes, although embodiments for the computing system 100 have been described with the extra protection data 210 protecting the user data 204 or some permutation of the user data 204, it is understood that the computing system 100 can operate differently. For example, the computing system 100 can generate additional protection 306 for protecting and encoding the extra protection data 210. The additional protection 306 can correspond to the extra protection data 210, along with or the without base set 208 or the base protection data 206. The computing system 100 can generate the additional protection 306 using a different encoding mechanism 308. The different encoding mechanism 308 can represent an additional encoding option for the computing system to generate the extra protection data 210 with different portions of the data unit 202 of FIG. 2. As an example, each iteration can include an increasing amount of the data unit 202 as user data to compute the extra protection data 210 such that the additional protection 306 can be generated even as one of the extra protection data 210.

Although optional, if the computing system 100 is configured to protect the extra protection data 201 by generating the additional protection 306, the different coding mechanism 308 can be implemented as a circuit, a device, a method, a system, a process, or a combination thereof for converting data from one form to another different from the encoding-decoding mechanism 170 of FIG. 1. The different coding mechanism 308 can be a different circuit, process, or function, an implementation of a different algorithm, or a combination thereof.

For the base set 208 stored on bad pages, the computing system 100 can further generate the extra protection data 210 independent of or separate from the group parity data. The extra protection data 210 can be associated or correlated with the corresponding instance of the base set 208, and stored on a known good page.

The computing system 100 can further store the base set 208 in locations that can be accessed with least latency or complexity. The computing system 100 can store the extra protection data 210 at locations without being limited by the latency or complexity.

It has been discovered that the extra protection data 210 provides increased flexibility. The flash page storing the base set 208 can remain unchanged. This means the extra protection data 210 can be added to any base set 208 at any time, even after the codewords have been encoded and stored in flash. For example, during the lifetime of a NAND flash SSD, some pages can be more error prone than other pages and have more error bits. Then, instead of marking such page as invalid and stopping usage of them, the computing system 100 can use extra protection data 210 to provide increased error correction power to these "bad pages" by generating the extra protection data 210 and storing them in separate "good" locations.

Figure 4:
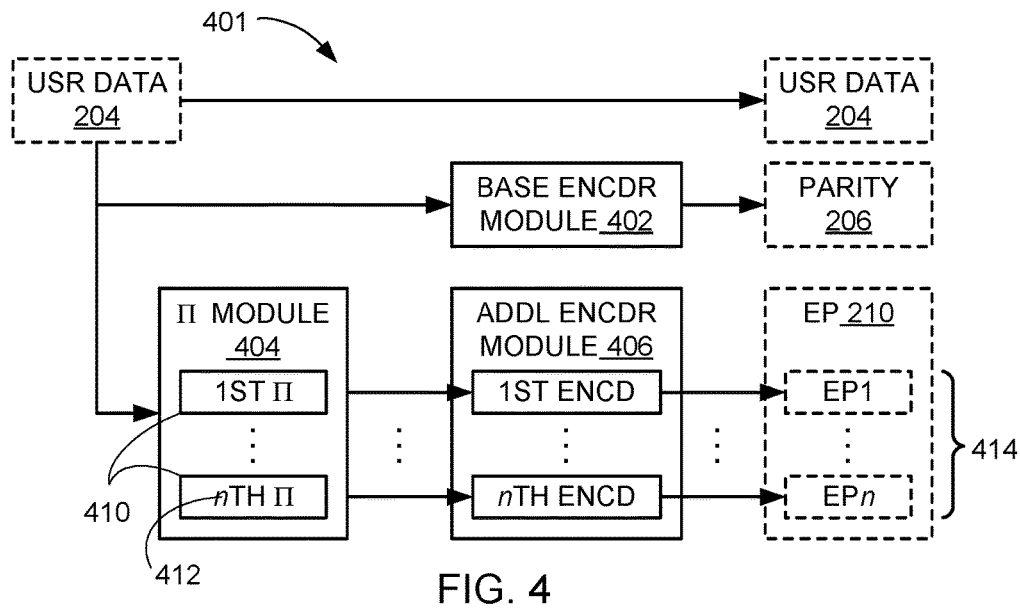
FIG. 4 is an exemplary architectural diagram of an encoder in an embodiment.

Referring now to FIG. 4, therein is shown an exemplary architectural diagram of an encoder 401 in an embodiment. The encoder 401 can include a circuit, a function, a process, a method, or a combination thereof for converting information into a coded format. The encoder 401 can correspond to a circuit, a device, a function, or a combination thereof for encrypting, generating protection, transmitting, storing, or a combination thereof for the user data 204 of FIG. 2.

For illustrative purposes, the encoder 401 is discussed as being implemented for LDPC encoding. The encoder 401 can process the user data 204, the base set 208 of FIG. 2, or a combination thereof based on or using the LDPC coding mechanism 172 of FIG. 1. However, it is understood that the encoder 401 can include other designs or implementations for different coding schemes as discussed above.

The encoder 401 can generate the base protection data 206 for the user data 204, the extra protection data 210, or a combination thereof as output. The base protection data 206, the extra protection data 210, or a combination thereof can include information utilized to detect any errors, recover from errors or lost information, or a combination thereof in accessing the user data 204 at a later time, using a different device, or a combination thereof.

The encoder 401 can determine the user data 204, such as by accessing stored information, receiving information from another device, receiving information based on interfacing with one or more users, or a combination thereof. The encoder can use the user data 204 as an input parameter for the encoding process.

The encoder 401 can include a base encoder module 402, an encoder permutation module 404, an additional encoder module 406, or a combination thereof for encoding the user data 204. The base encoder module 402 can be coupled to the additional encoder module 406, the encoder permutation module 404, or a combination thereof.

The modules can be coupled using wired or wireless connections, by having an output of one module as an input of the other module, by having operations of one module influence operation of the other module, or a combination thereof. The modules can be directly coupled with no intervening structures or objects other than the connector there-between, or indirectly coupled through intervening structures or objects.

The base encoder module 402 is configured to encode the user data 204. The base encoder module 402 can generate the base protection data 206 based on encoding the user data 204. Specific configuration of the base encoder module 402 can be based on specific or targeted code rate and design.

For example, the base encoder module 402 can encode the user data 204 according to the LDPC coding mechanism 172. The base encoder module 402 can generate the base protection data 206 according to the LDPC coding mechanism 172 using the user data 204 as input. The encoder 401 can use the base encoder module 402 to generate the base set 208 including the user data 204 and the base protection data 206. As a more specific example, the base encoder module 402 can encode based on sparse parity-check matrix subject to a sparsity constraint, a generator matrix, or a combination thereof.

After performing initial encoding, the control flow can pass from the base encoder module 402 to the encoder permutation module 404, the additional encoder module 406, or a combination thereof. For example, the control flow can pass by having a processing result, such as the base protection data 206, the user data 204, a portion thereof, or a combination thereof as an output from the base encoder module 402 to an input of the encoder permutation module 404, the additional encoder module 406, or a combination thereof.

Also for example, the control flow can further pass by storing the processing result at a location known and accessible to the encoder permutation module 404, the additional encoder module 406, or a combination thereof. Also for example, the control flow can further pass by notifying the encoder permutation module 404, the additional encoder module 406, or a combination thereof, such as by using a flag, an interrupt, a status signal, or a combination thereof. Also for example, the control flow can further pass using a combination of the processes described above.

The encoder permutation module 404 is configured to alter the user data 204 or provide different permutations or related unique remappings. The encoder permutation module 404 can generate one or more user data permutations 410. The user data permutations 410 are each a unique arrangement, alteration, derivation, or a combination thereof for the user data 204. The encoder permutation module 404 can generate one or more user data permutations 410 for further encoding or for the extra protection data 210.

For example, the encoder permutation module 404 can generate the one or more user data permutations 410 based on rearranging or shifting portions, symbols, or bits of the user data 204. Also for example, the encoder permutation module 404 can generate the one or more user data permutations 410 based on altering or changing values, bit flipping, setting to a predetermined value, or a combination thereof for one or more portions or values within the user data 204.

The encoder permutation module 404 can generate the one or more user data permutations 410 according to a pattern, an equation, a method, a process, a circuit, a set sequence, or a combination thereof predetermined by the computing system 100. The predetermined mechanism can dictate the manipulation of values, orders or positions of values, or a combination thereof for the user data 204.

For example, the encoder permutation module 404 can generate the one or more user data permutations 410 by flipping each of the bits in the user data 204, such as changing "0" to "1" and "1" to "0". Also for example, the encoder permutation module 404 can generate the one or more user data permutations 410 by barrel shifting half the content of the user data 204 by half its length, such as by placing the first half of the values in the second half position and the second half of the values in the first half position.

The encoder permutation module 404 can perform or determine a number of different permutations corresponding to a permutation set size 412. The permutation set size 412 can represent a number of unique permutations of the user data 204. The permutation set size 412 can further correspond to a number of unique extra protection data output or the number of additional encoding process or iterations, as illustrated using 1ST through nTH instances. The multiple different permutations can each be unique or different from each other.

The permutation set size 412 can correspond to a coding-strength enhancement measure 414. The coding-strength enhancement measure 412 is an increase in the correction power or the maximum number of recoverable bits associated with the extra protection data 210. The coding-strength enhancement measure 412 can be the difference in the total correction power with the extra protection data 210 and the total correction power associated with using the base protection data 206 without the extra protection data 210.

After generating the different permutations for the encoding process, the control flow can pass from the encoder permutation module 404 to the additional encoder module 406. The control flow can pass in a manner similar to the manner described above between the base encoder module 402 and the encoder permutation module 404 or the additional encoder module 406, but using the processing results of the encoder permutation module 404, such as the one or more user data permutations 410.

The additional encoder module 406 is configured to encode using the user data permutations 410. The additional encoder module 406 can generate the extra protection data 210 as a result of encoding the user data permutations 410. The additional encoder module 406 can include or be implemented as one or more additional encoding modules or processes, for each unique permutation.

The additional encoder module 406 can encode one or more different permutations to generate the extra protection data 210. The additional encoder module 406 can generate the extra protection data 210 including one or more unique value sets as an output corresponding to each unique permutation.

The additional encoder module 406 can encode similarly or same as the base encoder module 402. For example, the additional encoder module 406 can encode using a same method, process, mechanism, circuit, function, algorithm, or a combination thereof as the base encoder module 402, but using the different permutations for the user data 204. As a more specific example, the additional encoder module 406 can implement the LDPC coding mechanism 172.

The computing system 100 can include or implement the base encoder module 402, the additional encoder module 406, each encoding process, or a combination thereof each as a separate circuit, function, module, process, or a combination thereof. The computing system 100 can also include or implement the base encoder module 402, the additional encoder module 406, and each encoding process each as iteration for a circuit, a function, a module, a process, or a combination thereof. For example, the base protection data 206, the extra protection data 210 or each of the multiple instances thereof, or a combination thereof can be iteratively generated using circuit, function, module, process, or a combination thereof.

The additional encoder module 406 can store the extra protection data 210 along with or at a same location as the user data 204. The additional encoder module 406 can further store the extra protection data 210 separately or at different locations from the user data 204 as discussed above, such as on different memory pages. The additional encoder module 406 can further store multiple instances of the extra protection data 210 together or at a same location, such as a memory page, or separately or at different locations, such as on different memory pages.

The encoding process for calculating or generating the extra protection data 210 can leave the base set 208 unchanged, in the example for a systematic codeword. The extra protection data 210 can be based on computation as utilized in a corresponding decoder.

The encoder 401 can use, include, or be implemented with or as a portion within one or more control circuits 103 of FIG. 1, such as for the host central processing unit 104 of FIG. 1, the host memory 106 of FIG. 1, the host bus controller 108 of FIG. 1, the data storage system 101 of FIG. 1, the storage engine 115 of FIG. 1, a portion thereof, or a combination thereof. The computing system 100 can store the various input or output information, such as the user data 204, the base protection data 206, the base set 208, the extra protection data 210, or a combination thereof in one or more storage circuits 105 of FIG. 1, such as for the host memory 106, the memory cache 117 of FIG. 1, the solid state disk 110 of FIG. 1, the non-volatile memory 112 of FIG. 1, the hard disk drives 116 of FIG. 1, the NAS devices 122 of FIG. 1, or a combination thereof. The encoder 401 can be implemented in software, such as using functions or operators, in hardware, such as using circuits with registers or adders or multipliers, or a combination thereof.

The computing system 100 can calculate or generate the extra protection data 210 together with or immediately subsequent to the encoding process. The computing system 100 can further calculate or generate the extra protection data 210 separately or at a later time than the encoding process, such as when performance metrics for the data pages storing the base set 208 fall below a predetermined threshold. The computing system 100 can later access, receive, or recall the extra protection data 210 during the decoding process as discussed above.

Figure 5:
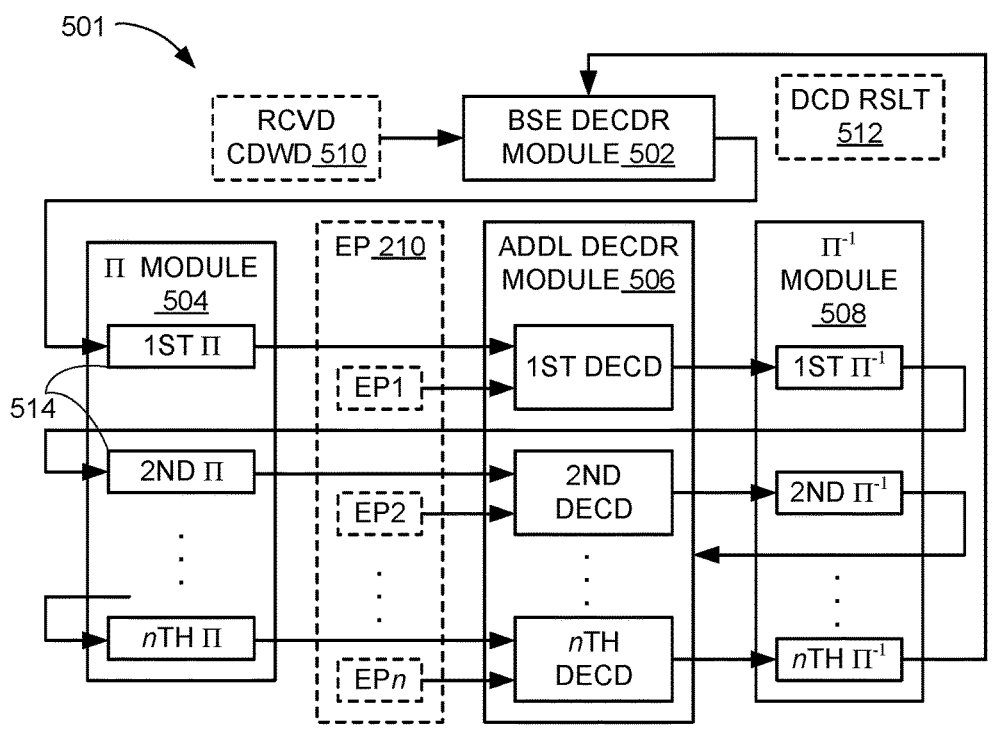
FIG. 5 is an exemplary architectural diagram of a decoder in an embodiment.

Referring now to FIG. 5, therein is shown an exemplary architectural diagram of a decoder 501 in an embodiment. The decoder 501 can be utilized to recover the user data 204 of FIG. 2, the base protection data 206 of FIG. 2, or a combination thereof to detect or correct errors within a received codeword 510 corresponding to the user data 204, the base protection data 206, or a combination thereof.

The received codeword 510 can include the accessed or received data corresponding to or intended to be the user data 204, the base protection data 206, or a combination thereof. The received codeword 510 can include errors or corruptions and can be different from the user data 204, the base protection data 206, or a combination thereof.

The decoder 501 can include a circuit, a function, a process, a method, or a combination thereof for reverting information from a coded format to recover the originally intended information. The decoder 501 can correspond to a circuit, a device, a function, or a combination thereof for decrypting, receiving, recalling or accessing stored information, or a combination thereof for the received codeword 510 corresponding to the user data 204.

The decoder 501 can decode the received codeword 510 based on the access or received instance of the base set 208 of FIG. 2, the data unit 202 of FIG. 2, or a combination thereof. The decoder 501 can utilize the base protection data 206, the extra protection data 210 of FIG. 2, or a combination thereof for the decoding process. The decoder module 501 can be implemented for the LDPC coding mechanism 172 of FIG. 1.

For an illustrative example, the decoder 501 can include a base decoder module 502, a decoder permutation module 504, an additional decoder module 506, a permutation inverse module 508, or a combination thereof. The base decoder module 502 can be coupled to the decoder permutation module 504. The decoder permutation module 504 can be coupled to the additional decoder module 506. The additional decoder module 506 can be coupled to the permutation inverse module 508, the decoder permutation module 504.

The base decoder module 502 is configured to decode the received codeword 510. The base decoder module 502 can use the encoding-decoding mechanism 170 of FIG. 1, such as the LDPC coding mechanism 172, to recover the user data 204 using the base protection data 206 or portions of the received codeword 510 corresponding thereto.

For example, the base decoder module 502 can use the sparse parity-check matrix subject to the sparsity constraint, the generator matrix, or a combination thereof for the decoding process. Also for example, the base decoder module 502 can calculate one or more decoding results 512 including soft decision values, such as a likelihood or a log-likelihood ratio (LLR), for decoding the received codeword 510.

The decoder 501 can initially try to decode the received codeword 510 with the base decoder module 502. The decoder 501 can initially try to decode the received codeword 510 without the extra protection data 210. If the initial decoding process fails with the base decoder module 502, the decoder 501 can load corresponding instances of the extra protection data 210 and perform the additional decoding process.

If the initial decoding process fails with the base decoder module 502 or using the received codeword 510 without the extra protection data 210, the control flow can pass from the base decoder module 502 to the decoder permutation module 504. The control flow can pass in a manner similar to the manner described above between the base encoder module 402 of FIG. 4 and the encoder permutation module 404 of FIG. 4, but using the processing results of the base decoder module 502, such as the initial instance of the decoding results 512, the received codeword 510, a processing result thereof, or a combination thereof.

The decoder permutation module 504 is configured to alter the received codeword 510. The decoder permutation module 504 can alter by performing or determining one or multiple different permutations of the received codeword 510 or a portion therein, such as corresponding to the user data 204. The decoder permutation module 504 can generate one or more received data permutations 514 based on altering the received codeword 510 or a portion therein.

The decoder permutation module 504 can generate each of the received data permutations 514 differently or uniquely for each value of the extra protection data 210. The decoder permutation module 504 can generate the received data permutation 514 similar to or same as the encoding permutation module 404 of FIG. 4, such as in the pattern or the methodology in generating the alterations or the permutations.

For example, the decoder permutation module 504 and the encoder permutation module 404 can be the same function, circuitry, mechanism, or a combination thereof. The received data permutations 514 can parallel the user data permutations 410 of FIG. 4.

After generating received data permutation 514 for the decoding process, the control flow can pass from the decoder permutation module 504 to the additional decoder module 506. The control flow can pass in a manner similar to the manner described above between the base encoder module 402 and the encoder permutation module 404 or the additional encoder module 406, but using the processing results of the decoder permutation module 504, such as the received data permutation 514 as discussed above. The control flow can further pass based on the extra protection data 210 to the additional decoder module 506.

The additional decoder module 506 is configured to provide enhanced or extra decoding process. The additional decoder module 506 can process the received data permutations 514 for recovering the base set 208. The additional decoder module 506 can process the received data permutation 514 when the base or initial decoding process with the base protection data 206 is insufficient.

The additional decoder module 506 can decode the one or more received data permutations 514 using the extra protection data 210. The additional decoder module 506 can decode each of the received data permutations 514 using corresponding value set of the extra protection data 210, as illustrated by the index values '1' through 'n'. The additional decoder module 506 can process to recover the base set 208 based on the pairings between corresponding instances of the permutations and the extra protection that parallel the relationship between the user data and the base protection data.

The additional decoder module 506 can decode similarly as the base decoder module 502. For example, the additional decoder module 506 can decode based on the LDPC coding mechanism 172. Also for example, the additional decoder module 506 can decode based on calculating soft decoder results or outputs, such as a likelihood or a log-likelihood ratio (LLR), for decoding the received codeword 510. Also for example, the additional decoder module 506 can decode based on the sparse parity-check matrix subject to the sparsity constraint, the generator matrix, the different permutation thereof, or a combination thereof.

After the additional decoding process, the control flow can pass from the additional decoder module 506 to the permutation inverse module 508. The control flow can pass in a manner similar to the manner described above between the base encoder module 402 and the encoder permutation module 404 or the additional encoder module 406, but using the processing results of the additional decoder module 506, such as results of additional decoding process.

The permutation inverse module 508 is configured to reverse the alterations or the changes for the permutations. The permutation inverse module 508 can alter by performing or determining opposite or reverse operations or values. The permutation inverse module 508 can output the received codeword 510 for subsequent processing.

The permutation inverse module 508 can perform or determine the one or multiple subsequent permutations using a process, a method, a function, a circuit, a mechanism, or a combination thereof coupled or complementary to the decoding permutation module 504. For example, the permutation inverse module 508 can perform or determine the one or multiple subsequent permutations reverse of or inverted from the permutation of the decoding permutation module 504.

The decoder 501 can check the result of the decoding process, such as a parity check, to validate the decoding process. The decoder 501 can continue the decoding process, such as using subsequent instances of the extra protection data 210. The decoding process can continue until the decoding process succeeds or until a predetermined limit of decoding limitation. The decoding process can continue as exemplified in FIG. 5. For example, after decoding with the nTH extra protection data 210 of FIG. 2, the decoding result can be passed back to the base decoder module 502 for furthering or continuing the decoding process.

As exemplified in FIG. 5, when the decoding iteration fails, the received codeword 510 can be properly permuted, and then combined with the extra protection data (EPi). The various permutation iterations or process can be represented as blocks $\Pi_i$ for the decoding permutations, which is shown as $\Pi$module an described as the decoder permutation module 504 and the corresponding instance of the inverse permutations can be represented as blocks $\Pi_i^{-1}$, which is shown as $\Pi^{-1}$ module and described as the permutation inverse module 508.

Continuing with the specific example, if the LDPC decoding succeeds in any stage, the decoder 501 can terminate the decoding process, output the successfully decoded codeword, or a combination thereof. If the decoding process using the last EP (EPn) still fails, its output LLR, such as for the user data 204, can be sent to the base decoder module 502 or the initial decoding process, such as for decoding with original parity. Such iteration continues until either decoding success or the predefined maximum number of iterations has been reached.

Continuing with the specific example, the decoder 501 can perform the iterations using one or more instances of LDPC decoder module, function, circuit, or a combination thereof. The multiple decoder blocks and the permutation blocks can be for illustrating the process. The LLR output values can be stored in memory of a single LDPC decoder hardware and the permutations can be done in-place.

The decoder 501 can decode according to a design of the permutations, post processing of the decoding output for each of the decoding iterations, or a combination thereof. The permutations, the corresponding inverse permutation, the post processing, or a combination thereof can be predetermined by the computing system 100, a standard, a user, or a combination thereof.

The decoder 501 can use or be implemented as a portion within one or more control circuits 103 of FIG. 1, such as for the host central processing unit 104 of FIG. 1, the host memory 106 of FIG. 1, the host bus controller 108 of FIG. 1, the data storage system 101 of FIG. 1, the storage engine 115 of FIG. 1, a portion thereof, or a combination thereof. The computing system 100 can store the various input or output information, such as the user data 204, the base protection data 206, the base set 208, the extra protection data 210, syndromes 514 or 516, the primitive root 518, the location indicator 520, or a combination thereof in one or more storage circuits 105 of FIG. 1, such as for the host memory 106, the memory cache 117 of FIG. 1, the solid state disk 110 of FIG. 1, the non-volatile memory 112 of FIG. 1, the hard disk drives 116 of FIG. 1, the NAS devices 122 of FIG. 1, or a combination thereof. The decoder 501 can be implemented in software, such as using functions or operators, in hardware, such as using circuits with registers or adders or multipliers, or a combination thereof.

For illustrative purposes, the computing system 100 has been described with each of the encoding or decoding iteration as being separate and independent from each other. For example, the further decoding of the received codeword 510 based on generating the received data permutation (514) and subsequently decoding the permutation can be separate from and unaffected by the initial decoding of the received codeword 510 except for the overall fail status. The decoding results 512 or the encoding results of one iteration has been described as being unaffected by another.

However, it is understood that the same concepts described above can be adapted to leverage each iteration. For example, the encoding process can permute and encode the resulting output of a preceding iteration, instead of permuting and encoding the user data 204 at each iteration. Also for example, the encoding process can permute and further process or combine the decoding result 512 of the preceding iteration, instead of permuting and decoding the received codeword 510 at each iteration.

As a more specific example, the user data 204 and base protection data 206 can be sent to the LDPC decoder. If decoding fails, the output log likelihood ratio (LLR) of user data part can be properly permuted, and then combined with extra parity (EPi). If using the last EP (EPn) still cannot decode, its output LLR (of the user data part) will be send to the first step.

Figure 6:
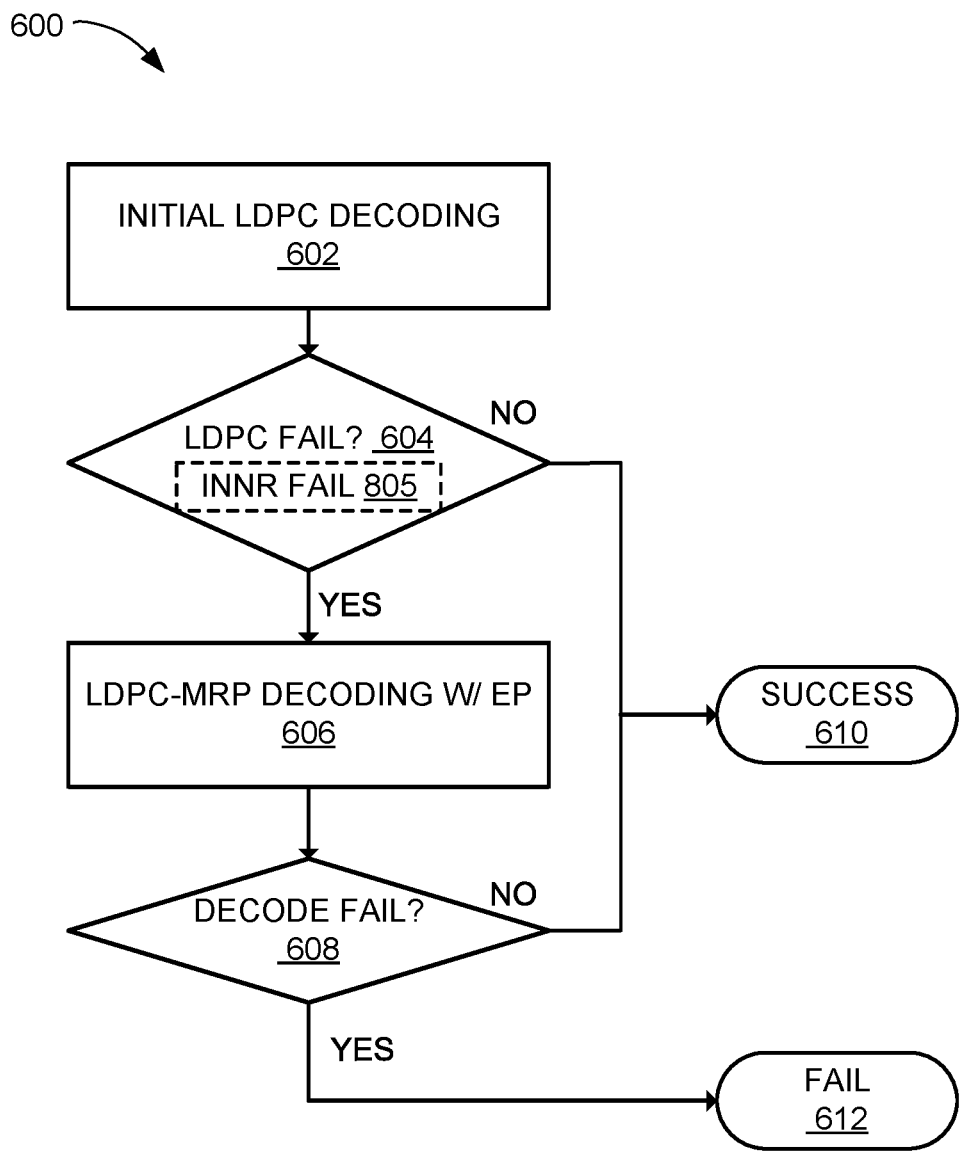
FIG. 6 is an exemplary flow diagram of the decoder of FIG. 5 in an embodiment.

Referring now to FIG. 6, therein is shown an exemplary flow diagram 600 of the decoder 501 of FIG. 5 in an embodiment. The diagram 600 can include initial LDPC decoding as represented in a box 602, initial check for LDPC parity pass/fail represented in a box 604, decoding LDPC with multiple redundant parts (MRP) using extra parity represented in a box 606, subsequent check for parity pass/fail represented in a box 608, successful decoding as represented in a box 610, and a failed decoding attempt as represented in a box 612.

The computing system 100 of FIG. 1 can implement the initial decoding of box 602 using the base decoder module 502 of FIG. 5 without the additional decoder module 506 of FIG. 5. The initial decoding of box 602 can be performed using the received codeword 510 of FIG. 5 corresponding to the base set 208 of FIG. 2, without utilizing the extra protection data 210 of FIG. 2.

The computing system 100 can check the parity, as represented in the box 604, based on the result of the decoding process represented in the box 602. If the parity check passes, the decoding process is considered a success, as represented in the box 610.

The computing system 100 can determine an inner-decoding failure status 805 based on failing the parity check for the base set 208. The additional decoding process that utilizes the extra parity, or the extra protection data 210, as represented in the box 606, can be utilized or implemented when the parity check represented in the box 604 fails.

The additional decoding process that utilizes the extra parity, or the extra protection data 510, as represented in the box 606, can be utilized or implemented if the parity check represented in the box 804 fails. For example, the computing system 100 can decode the received codeword 510 using the extra protection data 210 based on the inner-decoding failure status 508.

The additional decoding of the box 606 can use the additional decoder module 506, the decoder permutation module 504 of FIG. 5, the permutation inverse module 508 of FIG. 5, or a combination thereof. The additional decoding can be performed using the received codeword 510, the extra protection data 210, or a combination thereof.

The computing system 100 can subsequently check the parity, as represented in the box 608, based on the result of the additional decoding process represented in the box 606. If the parity check passes, the decoding process is considered a success, as represented in the box 610. If the parity check fails, the overall decoding process can be considered as failure.

Figure 7:
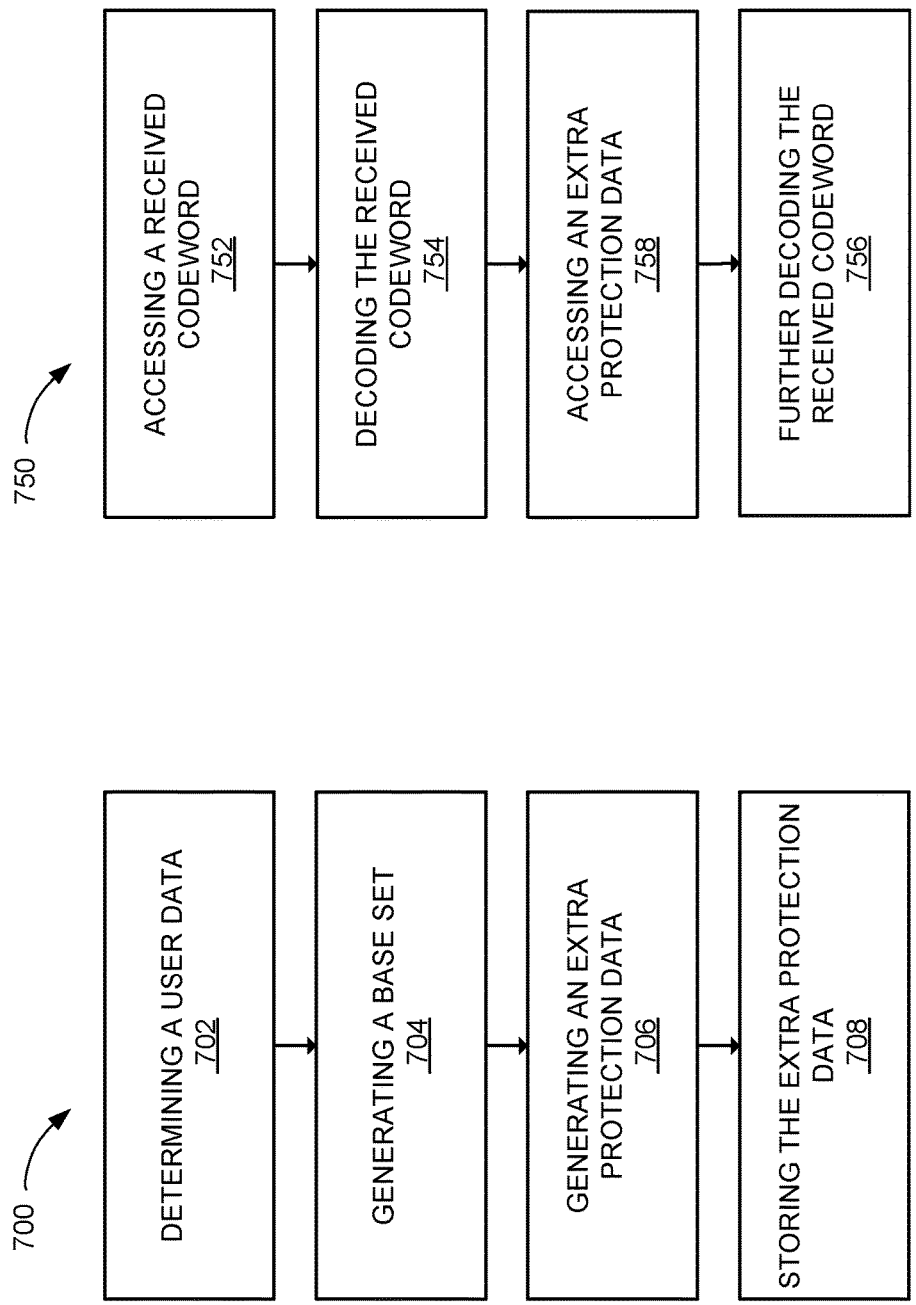
FIG. 7 is a flow chart of a method of operation of a computing system in an embodiment of the present invention.

Referring now to FIG. 7, therein is shown a flow chart of a method 700 of operation of a computing system 100 in an embodiment of the present invention. The method 700 includes: determining a user data in a block 702; generating a base set including a base protection data based on encoding the user data according to a Low-Density Parity-Check coding mechanism in a block 704; generating an extra protection data based on encoding the base set according to the Low-Density Parity-Check coding mechanism in a block 706; and storing the extra protection data corresponding to the base set in a block 708.

A further flow chart of a further method 750 of operation of the computing system 100 in an embodiment of the present invention is also shown in FIG. 7. The further method 750 includes: accessing a received codeword in a box 752; decoding the received codeword according to a Low-Density Parity-Check coding mechanism in a box 754; accessing an extra protection data corresponding to the received codeword in a box 756; and further decoding the received codeword to recover the user data using the extra protection data according to the Low-Density Parity-Check coding mechanism in a box 758.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. Another important aspect of an embodiment of the present invention is that it valuably supports and services the historical trend of reducing costs, simplifying systems, and increasing performance.

These and other valuable aspects of an embodiment of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A computing system comprising:
    a control circuit configured to:
        determine a user data,
        generate a base set including a base protection data based on encoding the user data according to a coding mechanism,
        generate an extra protection data based on encoding the user data differently from the base set according to the coding mechanism and generating a user data permutation based on selectively rearranging or altering the user data; and
    a storage circuit, coupled to the control circuit, configured to store the extra protection data corresponding to the base set.

2. The system as claimed in claim 1 wherein the control circuit is configured to generate the extra protection data based on generating the extra protection data based on encoding the user data permutation.

3. The system as claimed in claim 1 wherein the control circuit is configured to:
    determine a permutation set size corresponding to a coding-strength enhancement measure for representing a number of different permutations utilized to encode the user data;
    generate the extra protection data matching the permutation set size.

4. The system as claimed in claim 1 wherein the control circuit is configured to generate the extra protection data using an encoder module utilized to generate the base set.

5. The system as claimed in claim 1 wherein the storage circuit is configured to store the extra protection data in a data page different than storage of the base protection data.

6. A computing system comprising:
    a storage circuit configured to:
        provide a received codeword corresponding to a user data and a base protection data,
        provide an extra protection data corresponding to the received codeword;
    a control circuit, coupled to the storage circuit, configured to:
        decode the received codeword according to a coding mechanism,
        further decode the received codeword to recover the user data based on decoding differently from decoding the base set and using the extra protection data according to the coding mechanism; and
        further decode the received codeword based on generating a received data permutation based on selectively rearranging or altering the received codeword.

7. The system as claimed in claim 6 wherein the control unit is configured to further decode the received codeword based on decoding the received data permutation using the extra protection data for recovering the base set.

8. The system as claimed in claim 6 wherein the storage circuit is configured to provide the extra protection data from a data page different than storage of the base protection data.

9. The system as claimed in claim 6 wherein the control unit is configured to further decode the received codeword separate from and independent of an initial decoding result calculated based on decoding the received codeword.

10. The system as claimed in claim 6 wherein the control circuit is configured to:
    determine an inner-decoding failure status based on decoding the received codeword; and
    further decode the received codeword using the extra protection data based on the inner-decoding failure status.

11. A method of operation of a computing system comprising:
    determining a user data;
    generating a base set including a base protection data based on encoding the user data according to a coding mechanism;
    generating, with a control circuit, an extra protection data based on encoding the user data differently from the base set according to the coding mechanism and generating a user data permutation based on selectively rearranging or altering the user data; and
    storing the extra protection data corresponding to the base set.

12. The method as claimed in claim 11 wherein generating the extra protection data includes generating the extra protection data based on encoding the user data permutation.

13. The method as claimed in claim 11 wherein generating the extra protection data includes:
    determining a permutation set size corresponding to a coding-strength enhancement measure for representing a number of different permutations utilized to encode the user data;
    generating the extra protection data matching the permutation set size.

14. The method as claimed in claim 11 wherein generating the extra protection data includes generating the extra protection data using an encoder module utilized to generate the base set.

15. The method as claimed in claim 11 wherein storing the extra protection data includes storing the extra protection data in a data page different than storage of the base protection data.

16. A method of operation of a computing system comprising:
    accessing a received codeword;
    decoding the received codeword according to a coding mechanism;
    accessing an extra protection data corresponding to the received codeword;
    further decoding, with a control circuit, the received codeword to recover the user data based on decoding differently from decoding the base set and using the extra protection data according to the coding mechanism; and further decoding the received codeword based on generating a received data permutation based on selectively rearranging or altering the received codeword.

17. The method as claimed in claim 16 wherein further decoding the received codeword includes decoding the received data permutation using the extra protection data for recovering the base set.

18. The method as claimed in claim 16 wherein accessing the extra protection data includes accessing the extra protection data stored at a data page different than storage of the base protection data.

19. The method as claimed in claim 16 wherein further decoding the received codeword includes further decoding the received codeword separate from and independent of an initial decoding result calculated based on decoding the received codeword.

20. The method as claimed in claim 16 further comprising:

determining an inner-decoding failure status based on decoding the received codeword; and wherein further decoding the received codeword includes:

further decoding the received codeword using the extra protection data based on the inner-decoding failure status.

* * * * *